United States Patent
Saeki

(10) Patent No.: US 11,353,909 B2
(45) Date of Patent: Jun. 7, 2022

(54) OPERATIONAL AMPLIFIER, INTEGRATED CIRCUIT, AND METHOD FOR OPERATING THE SAME

(71) Applicant: SYNAPTICS INCORPORATED, San Jose, CA (US)

(72) Inventor: Yutaka Saeki, Tokyo (JP)

(73) Assignee: Synaptics Incorporated, San Jose, CA (US)

( * ) Notice: Subject to any disclaimer, the term of this patent is extended or adjusted under 35 U.S.C. 154(b) by 124 days.

(21) Appl. No.: 16/832,914

(22) Filed: Mar. 27, 2020

(65) Prior Publication Data

US 2021/0303017 A1   Sep. 30, 2021

(51) Int. Cl.
*H03F 3/45*    (2006.01)
*G05F 3/26*    (2006.01)
*H03F 3/30*    (2006.01)

(52) U.S. Cl.
CPC ............. *G05F 3/26* (2013.01); *H03F 3/3016* (2013.01); *H03F 3/45192* (2013.01); *H03F 3/45744* (2013.01); *H03F 3/45753* (2013.01); *H03F 2203/30114* (2013.01)

(58) Field of Classification Search
CPC ............ G05F 3/26; H03F 3/45744; H03F 2203/30081; H03F 2203/30114; H03F 3/3016; H03F 3/45192; H03F 3/45753; H03F 3/45475; H03F 3/45748; H03F 3/45757; H03F 3/45762
See application file for complete search history.

(56) References Cited

U.S. PATENT DOCUMENTS

2009/0128238 A1* 5/2009 Lin ..................... H03F 3/45744
330/253
2016/0110581 A1  4/2016 Heo et al.

FOREIGN PATENT DOCUMENTS

| KR | 20160109017 A | 9/2016 |
| KR | 101859121 B1 | 5/2018 |
| WO | 2018057460 A1 | 3/2018 |

OTHER PUBLICATIONS

Written Opinion of the International Searching Authority issued in corresponding international application No. PCT/US2021/022215 dated Jul. 2, 2021 (6 pages).
International Search Report issued in corresponding international application No. PCT/US2021/022215 dated Jul. 2, 2021 (6 pages).

* cited by examiner

*Primary Examiner* — Jung Kim
(74) *Attorney, Agent, or Firm* — Ferguson Braswell Fraser Kubasta PC

(57) ABSTRACT

An operational amplifier comprises a front stage and an output stage. The front stage comprises a first input transistor, a second input transistor, a first node, a second node, and a first current mirror. A first voltage based on a first current through the first input transistor is generated on the first node. A second voltage based on a second current through the second input transistor is generated on the second node. The output stage is configured to output an output voltage based on at least one of the first voltage and the second voltage. The first current mirror comprises a first transistor having a drain connected to the first node, a second transistor having a drain connected to the second node, and a first offset canceling capacitor connected between gates of the first transistor and the second transistor.

16 Claims, 9 Drawing Sheets

OPERATIONAL AMPLIFIER, INTEGRATED CIRCUIT, AND METHOD FOR OPERATING THE SAME

BACKGROUND

Field

Embodiments disclosed herein generally relate to operational amplifiers, integrated circuits, and method for operating the same.

Description of the Related Art

An operational amplifier may exhibit an offset voltage due to manufacturing variations of circuit elements integrated in the operational amplifier. The offset voltage may cause a difference between actual and desired output voltages of the operational amplifier.

SUMMARY

This summary is provided to introduce in a simplified form a selection of concepts that are further described below in the Detailed Description. This summary is not intended to identify key features or essential features of the claimed subject matter, nor is it intended to limit the scope of the claimed subject matter.

In one or more embodiments, an operational amplifier is provided. The operational amplifier comprises a front stage and an output stage. The front stage comprises a first input transistor, a second input transistor, a first node, a second node, and a first current mirror. A first voltage based on a first current through the first input transistor is generated on the first node, and a second voltage based on a second current through the second input transistor is generated on the second node. The output stage is configured to output an output voltage based on at least one of the first voltage and the second voltage. The first current mirror comprises a first transistor having a drain connected to the first node, a second transistor having a drain connected to the second node, and a first offset canceling capacitor connected between gates of the first transistor and the second transistor.

In one or more embodiments, an integrated circuit is provided. The integrated circuit comprises an operational amplifier and input voltage supply circuitry. The input voltage supply circuitry is configured to supply an input voltage to the operational amplifier. The operational amplifier comprises a front stage and an output stage. The front stage comprises a first input transistor, a second input transistor, a first node, a second node, and a first current mirror. A first voltage based on a first current through the first input transistor is generated on the first node, and a second voltage based on a second current through the second input transistor is generated on the second node. The output stage is configured to output an output voltage based on at least one of the first voltage and the second voltage. The first current mirror comprises a first transistor having a drain connected to the first node, a second transistor having a drain connected to the second node, and a first offset canceling capacitor connected between gates of the first transistor and the second transistor.

In one or more embodiment, a method for operating an operational amplifier is provided. The method comprises preparing an operational amplifier that comprises a first input transistor, a second input transistor, a first node, a second node, and a first current mirror. A first voltage based on a first current through the first input transistor is generated on the first node, and a second voltage based on a second current through the second input transistor is generated on the second node. The current mirror is connected to the first node and the second node. The current mirror comprises a first transistor, a second transistor, and an offset canceling capacitor connected between gates of the first transistor and the second transistor. The method further comprises programming the offset canceling capacitor with an offset canceling voltage; and outputting an output voltage based on at least one of the first voltage and the second voltage.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

Figure 1:
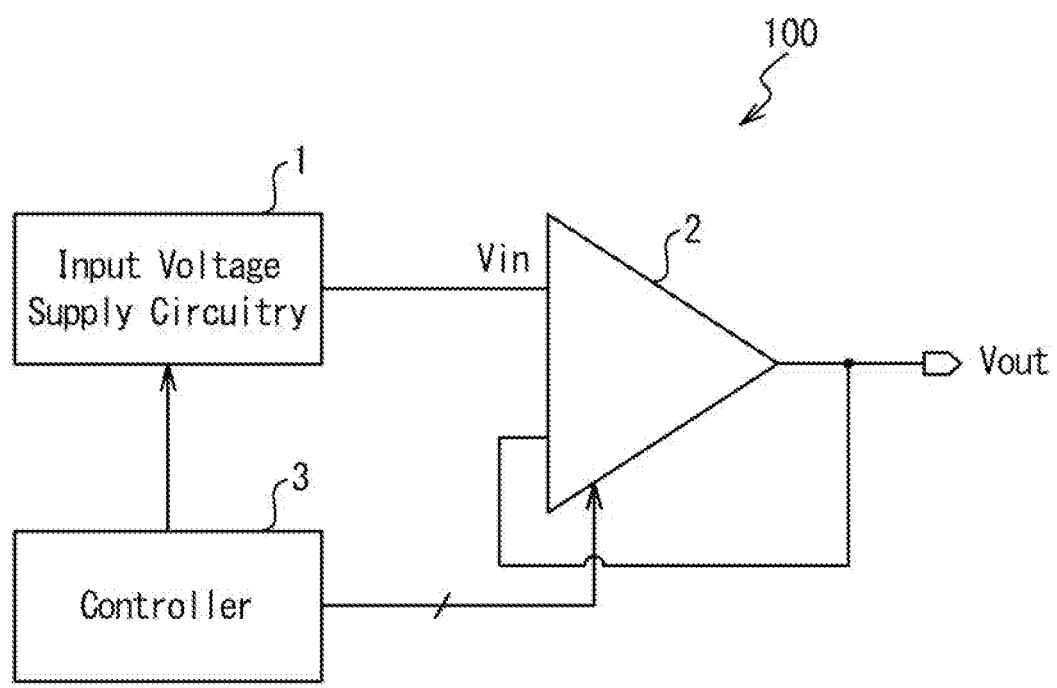
FIG. 1 illustrates an example configuration of an integrated circuit, according to one or more embodiments.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or the following detailed description.

Various embodiments of the present disclosure provide operational amplifiers, integrated circuits and methods that reduce offset voltages of the operational amplifiers. In one or more embodiments, an operational amplifier comprises an offset canceling capacitor programmed with an offset canceling voltage. The operational amplifier is configured to generate an output voltage using the offset canceling voltage. This effectively reduces the offset voltage of the operational amplifier.

FIG. 1 illustrates an example configuration of an integrated circuit 100, according to one or more embodiments. In the embodiment illustrated, the integrated circuit 100 comprises input voltage supply circuitry 1, an operational amplifier 2, and a controller 3. The input voltage supply circuitry 1 is configured to supply an input voltage Vin to the operational amplifier 2. In some embodiments, the input voltage Vin may range from 0V to 8V or from 0V to 6V. The operational amplifier 2 is configured as a voltage follower that generates an output voltage Vout in response to the input voltage Vin. In embodiments when the operational amplifier 2 operates as an ideal voltage follower with no offset voltage, the output voltage Vout has a voltage level which is identical to the voltage level of the input voltage Vin. In embodiments where the integrated circuit 100 is incorporated in a display driver that drives a display panel, the input voltage supply circuitry 1 may comprise a digital-to-analog converter (DAC) configured to generate the input voltage Vin through digital-to-analog conversion of image data and the operational amplifier 2 may be configured to drive a source line (which may be also referred as data line) of the display panel by supplying the output voltage Vout to the source line. The controller 3 is configured to generate control signals to control the operations of the input voltage supply circuitry 1 and the operational amplifier 2.

Figure 2:
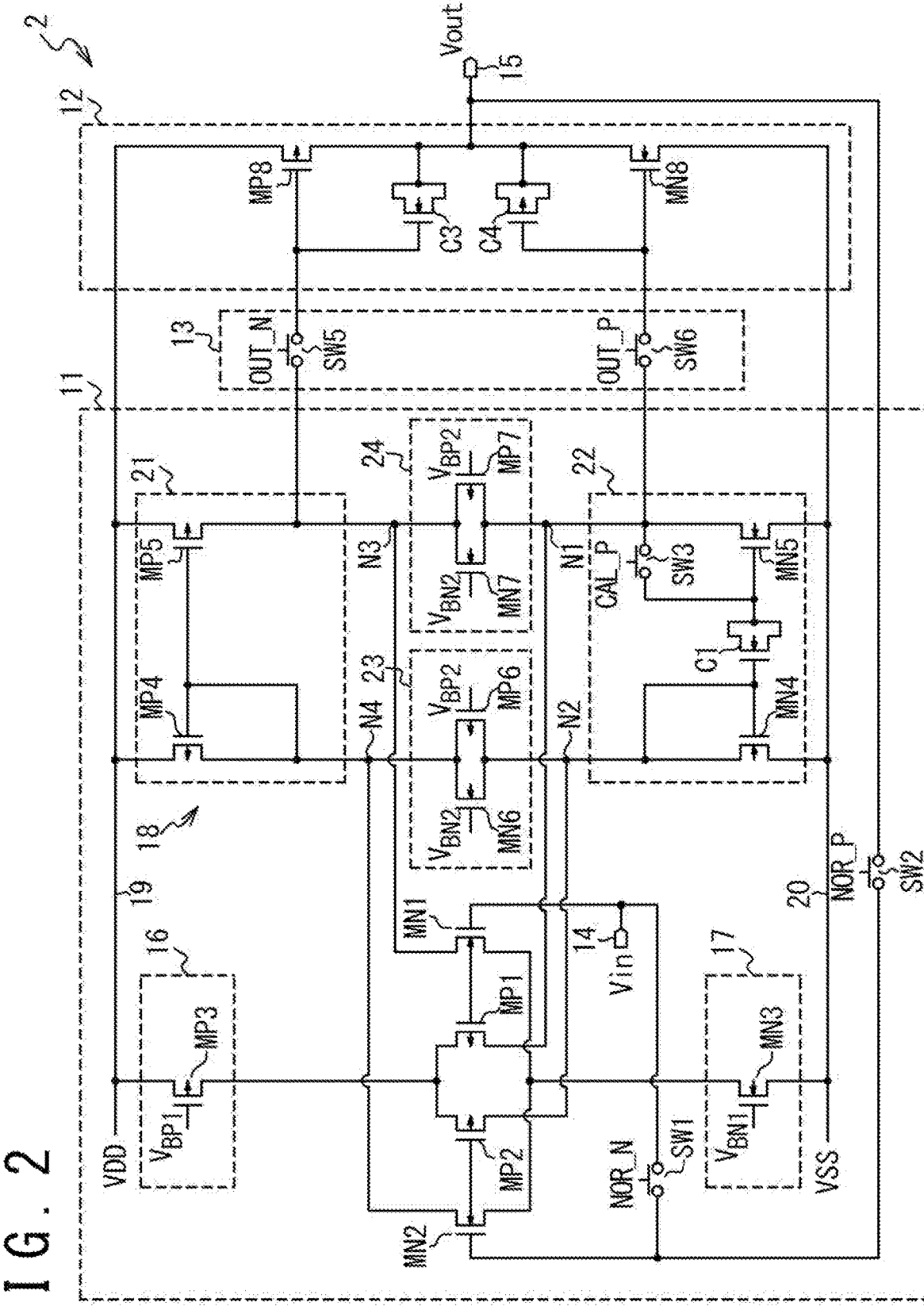
FIG. 2 illustrates an example configuration of an operational amplifier, according to one or more embodiments.

FIG. 2 illustrates an example configuration of the operational amplifier 2, according to one or more embodiments. In the illustrated embodiment, the operational amplifier 2 comprises a front stage 11, an output stage 12, and switch circuitry 13. The front stage 11 is configured to receive the input voltage Vin on an input terminal 14 and the output stage 12 is configured to generate the output voltage Vout on an output terminal 15 in response to the input voltage Vin. The switch circuitry 13 is configured to selectively connect and disconnect the output stage 12 to and from the front stage 11. In the illustrated embodiment, the switch circuitry 13 comprises connection switches SW5 and SW6 connected between the front stage 11 and the output stage 12. The connection switches SW5 and SW6 are controlled by switch control signals OUT_N and OUT_P received from the controller 3, respectively.

The front stage 11 comprises positive-channel metal-oxide semiconductor (PMOS) transistors MP1, MP2, negative-channel metal-oxide semiconductor (NMOS) transistors MN1, MN2, constant current sources 16, 17, short-circuit switch SW1, feedback path switch SW2, and an active load 18.

The PMOS transistors MP1 and MP2 are used as a first pair of input transistors. The PMOS transistors MP1 and MP2 have sources commonly connected to the constant current source 16. The drain of the PMOS transistor MP1 is connected to a node N1 of the active load 18, and the drain of the PMOS transistor MP2 is connected to a node N2 of the active load 18. Accordingly, the voltage generated on the node N1 depends on the current through the PMOS transistor MP1, and the voltage generated on the node N2 depends on the current through the PMOS transistor MP2. The gate of the PMOS transistor MP1 is connected the input terminal 14, and the gate of the PMOS transistor MP2 is connected to the output terminal 15 via the feedback path switch SW2.

The constant current source 16 is configured to supply a constant current to the commonly-connected sources of the PMOS transistors MP1 and MP2. In one implementation, the constant current source 16 may comprise a PMOS transistor MP3 having a gate biased with a fixed bias voltage $V_{BP1}$. The bias voltage VBP1 may be VDD−Vthp3, where VDD is a power source voltage and the Vthp3 is the threshold voltage of the PMOS transistor MP3. The power source voltage VDD may range from 4.0V to 8.0V. In one implementation, the bias voltage $V_{BP1}$ may be in a range from VDD−1.0V to VDD−0.5V The source of the PMOS transistor MP3 is connected to a power source line 19 on which the power source voltage VDD is generated, and the drain of the PMOS transistor MP3 is connected to the commonly-connected sources of the PMOS transistors MP1 and MP2.

The NMOS transistors MN1 and MN2 are used as a second pair of input transistors. The NMOS transistors MN1 and MN2 have sources commonly connected to the constant current source 17. The drain of the NMOS transistor MN1 is connected to a node N3 of the active load 18, and the drain of the NMOS transistor MN2 is connected to a node N4 of the active load 18. Accordingly, the voltage generated on the node N3 depends on the current through the NMOS transistor MN1, and the voltage generated on the node N4 depends on the current through the NMOS transistor MN2. The gate of the NMOS transistor MN1 is connected to the gate of the PMOS transistor MP1 and further to the input terminal 14. The gate of the NMOS transistor MN2 is connected to the gate of the PMOS transistor MP2 and further to the output terminal 15 via the feedback path switch SW2.

The constant current source 17 is configured to draw a constant current from the commonly-connected sources of the NMOS transistors MN1 and MN2. In one implementation, the constant current source 17 may comprise an NMOS transistor MN3 having a gate biased with a fixed bias voltage $V_{BN1}$. The source of the NMOS transistor MN3 is connected to a circuit ground line 20, and the drain of the PMOS transistor MP3 is connected to the commonly-connected sources of the PMOS transistors MP1 and MP2. In one or more embodiments, the circuit ground line 20 is held at a circuit ground level VSS, which may be 0V.

The short-circuit switch SW1 is configured to short-circuit (e.g., electrically connect) the commonly-connected gates of the PMOS transistor MP1 and the NMOS transistor MN1 to the commonly connected gates of the PMOS transistor MP2 and the NMOS transistor MN2. The short-circuit switch SW1 is controlled by a switch control signal NOR_N received from the controller 3 of FIG. 1.

The feedback path switch SW2 is connected to between the output terminal 15 and the commonly connected gates of the PMOS transistor MP2 and the NMOS transistor MN2. The feedback path switch SW2 is controlled by a switch control signal NOR_P received from the controller 3 of FIG. 1. In some embodiments, the switch control signal NOR_N and switch control signal NOR_P may be complementary to each other.

The active load 18 is configured to control the output stage 12 based on the currents through the PMOS transistors MP1, MP2, and the NMOS transistors MN1 and MN2. In one or more embodiments, the active load 18 comprises current mirrors 21, 22, floating current sources 23, and 24. The current mirror 21 comprises PMOS transistors MP4 and MP5 that have commonly-connected gates connected to the drain of the PMOS transistor MP4. The sources of the PMOS transistors MP4 and MP5 are connected to the power source line 19. The drain of the PMOS transistor MP4 is connected to the node N4 and the drain of the PMOS transistor MP5 is connected to the node N3.

The current mirror 22 is configured to provide offset cancelling of the operational amplifier 2. In one or more embodiments, the current mirror 22 is configured to achieve the offset cancelling by controlling the output voltage Vout using an offset canceling voltage held across an offset canceling capacitor C1. The offset canceling voltage may be programmed across the offset canceling capacitor C1 in a calibration process of the operational amplifier 2. The voltage level of the offset canceling voltage may be determined to cancel the characteristic difference between the NMOS transistors MN1 and MN2 and/or the characteristic difference between the PMOS transistors MP1 and MP2. In the illustrated embodiment, the current mirror 22 further comprises NMOS transistors MN4, MN5, and a calibration enable switch SW3. The sources of NMOS transistors MN4 and MN5 are connected to the circuit ground line 20. The drain of the NMOS transistors MN4 is connected to the node N2 and the drain of the NMOS transistor MN5 is connected to the node N1. The offset canceling capacitor C1 is connected between the gates of the NMOS transistors MN4 and MN5. The offset canceling capacitor C1 is configured to hold the offset canceling voltage. In one implementation, a gate capacitance of an NMOS transistor may be used as the offset cancelling capacitor C1. The calibration enable switch SW3 is connected in series to the offset cancelling capacitor C1 between the nodes N1 and N2. The calibration enable switch SW3 is controlled by a switch control signal CAL_P received from the controller 3. In one implementation, the calibration enable switch SW3 is turned on during the calibration process to enable programming the offset canceling capacitor C1.

The floating current source 23 is configured to draw a first constant current from the node N4 and supply the first constant current to the node N2. In one implementation, the floating current source 23 comprises an NMOS transistor MN6 and a PMOS transistor MP6. The NMOS transistor MN6 has a drain connected to the node N4, a source connected to the node N2, and a gate biased with a fixed bias voltage $V_{BN2}$. The PMOS transistor MP6 has a source connected to the node N4, a drain connected to the node N2, and a gate biased with a fixed bias voltage $V_{BP2}$.

The floating current source 24 is configured to draw a second constant current from the node N3 and supply the second constant current to the node N1. In one implementation, the floating current source 24 comprises an NMOS transistor MN7 and a PMOS transistor MP7. The NMOS transistor MN7 has a drain connected to the node N3, a source connected to the node N1, and a gate biased with the fixed bias voltage $V_{BN2}$. The PMOS transistor MP7 has a source connected to the node N3, a drain connected to the node N1, and a gate biased with the fixed bias voltage $V_{BP2}$.

The output stage 12 is configured to generate the output voltage Vout based on the voltages generated on the nodes N1 and N3 of the active load 18. The output stage 12 comprises a PMOS transistor MP8, an NMOS transistor MN8, and phase compensation capacitors C3 and C4. The PMOS transistor MP8 is configured as a high-side output transistor that pulls up the output terminal 15. The PMOS transistor MP8 has a gate connected to the node N3 via the connection switch SW5 of the switch circuitry 13, a source connected to the power source line 19, and a drain connected to the output terminal 15. The NMOS transistor MN8 is configured as a low-side output transistor that pulls down the output terminal 15. The NMOS transistor MN8 has a gate connected to the node N1 via the connection switch SW6 of the switch circuitry 13, a source connected to the circuit ground line 20, and a drain connected to the output terminal 15. The phase compensation capacitors C3 and C4 provide phase compensation for the operational amplifier 2. The phase compensation capacitor C3 is connected between the gate and drain of the PMOS transistor MP8, and the phase compensation capacitor C4 is connected between the gate and drain of the NMOS transistor MN8.

In one or more embodiments, the operational amplifier 2 has an operation state and a calibration state. The controller 3 is configured to switch the operational amplifier 2 between the operation state and the calibration state by the switch control signals NOR_N, NOR_P, CAL_P, OUT_N, OUT_P, which control the short-circuit switch SW1, the feedback path switch SW2, the calibration enable switch SW3, the connection switches SW5, and SW6, respectively.

Figure 3A:
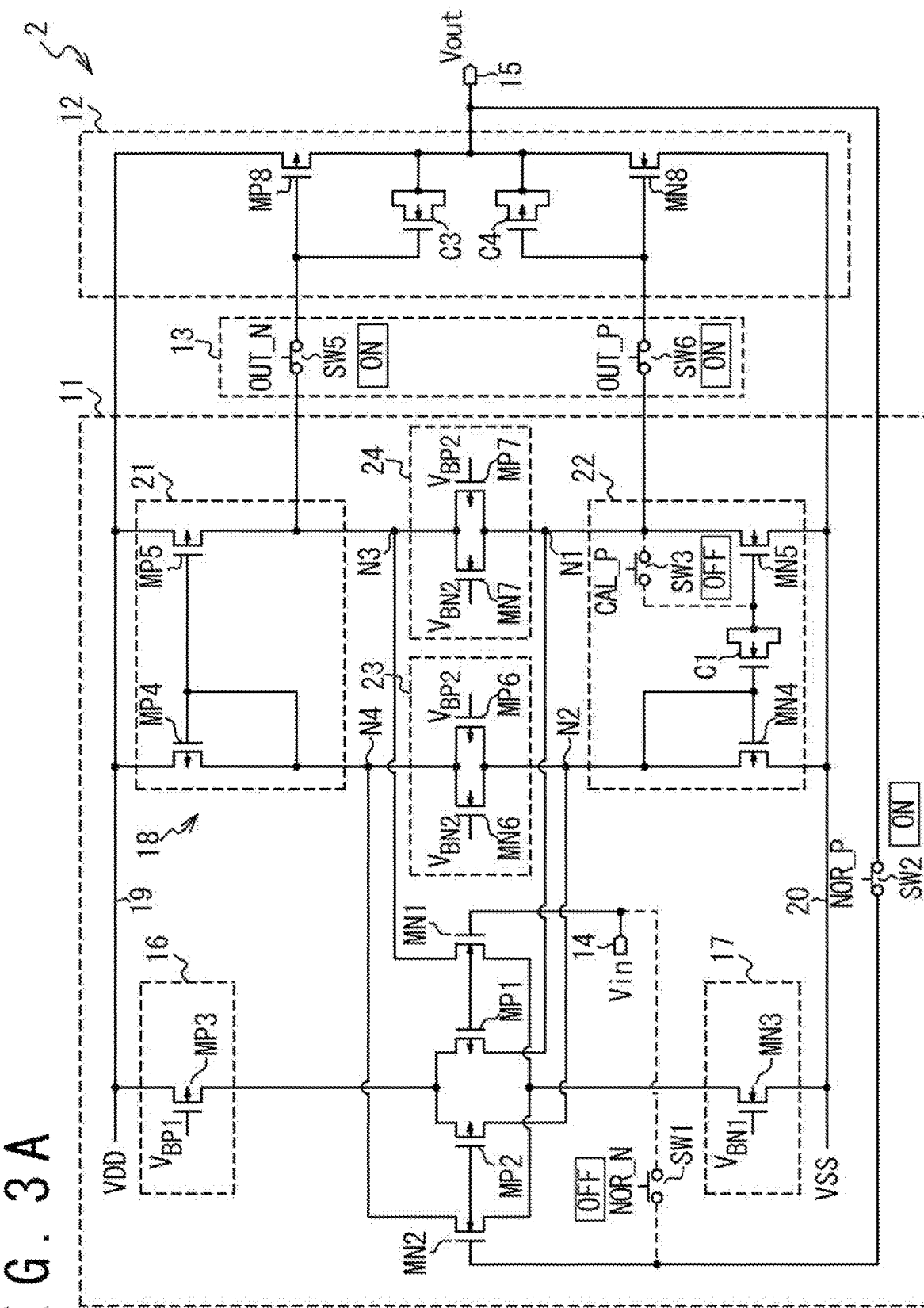
FIG. 3A illustrates an operation state of the operational amplifier, according to one or more embodiments.

In the operation state, the operational amplifier 2 operates as a voltage follower to drive the output voltage Vout in response to the input voltage Vin. FIG. 3A illustrates the operation state of the operational amplifier 2. In the operation state, the short-circuit switch SW1 and the calibration enable switch SW3 are turned off, and the feedback path switch SW2 and the connection switches SW5 and SW6 are turned on. This is achieved by deasserting the switch control signals NOR_N and CAL_P and asserting the switch control signals NOR_P, OUT_N, and OUT_P.

Figure 3B:
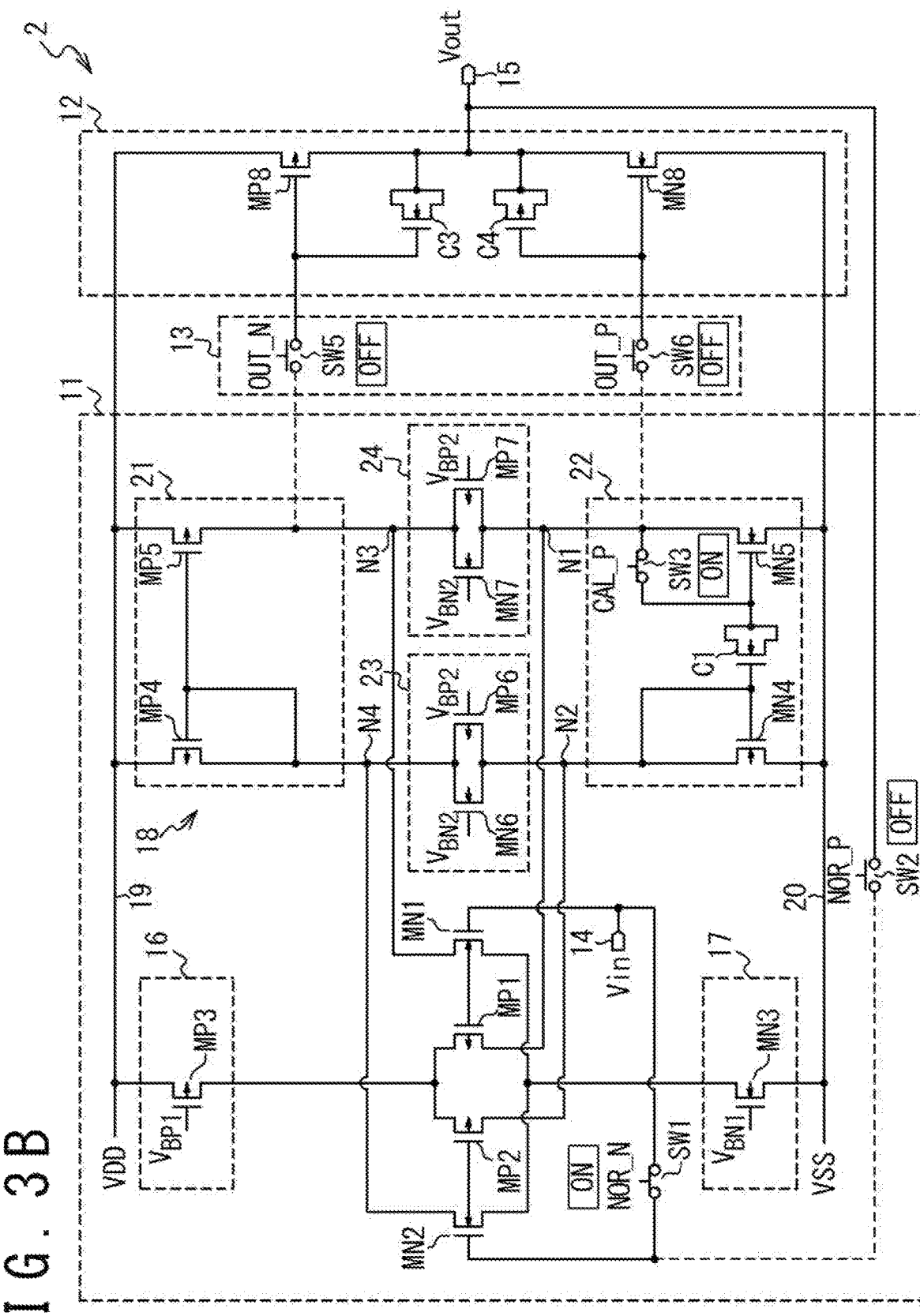
FIG. 3B illustrates a calibration state of the operational amplifier, according to one or more embodiments.

In the calibration state, the operational amplifier 2 is calibrated by programming the offset canceling capacitor C1 with an offset canceling voltage. FIG. 3B illustrates the calibration state of the operational amplifier 2. In the calibration state, the short-circuit switch SW1 and the calibration enable switch SW3 are turned on, and the feedback path switch SW2 and the connection switches SW5 and SW6 are turned off. This is achieved by asserting the switch control signals NOR_N and CAL_P and deasserting the switch control signals NOR_P, OUT_N, and OUT_P. The turn-on of the short-circuit switch SW1 allows short-circuiting the commonly-connected gates of the PMOS transistors MP1 and the NMOS transistor MN1 to the commonly-connected gates of the PMOS transistor MP2 and the NMOS transistor MN2, while the turn-on of the calibration enable switch SW3 leads to electrically connect the offset canceling capacitor C1 between the nodes N1 and N2. In embodiments where the operational amplifier 2 is configured ideally (that is, the operational amplifier 2 has no offset voltage), the voltage between the nodes N1 and N2 is zero in the calibration state, in which the short-circuit switch SW1 is turned on. In other embodiments, the voltage between the nodes N1 and N2 may be a non-zero voltage due to manufacturing variations of the circuit elements integrated in the operational amplifier 2. For example, the difference in the threshold voltage between the PMOS transistors MP1 and MP2 and/or the difference in the threshold voltage between the NMOS transistors MN1 and MN2 may cause a non-zero voltage between the nodes N1 and N2. In one or more embodiments, the offset canceling capacitor C1 is programmed with the non-zero voltage generated between the nodes N1 and N2 in the state in which the short-circuit switch SW1 is turned on. When the operational amplifier 2 is returned to the operation state, the operational amplifier 2 generates the output voltage Vout with the offset canceling voltage held across the offset canceling capacitor C1. This effectively reduces the offset voltage of the operational amplifier 2.

In one or more embodiments, the input voltage supply circuitry 1 is configured to change the input voltage Vin under the control of the controller 3, and the operational amplifier 2 may be configured to drive the output voltage Vout in response to the change in the input voltage Vin. In such embodiments, the operational amplifier 2 may be calibrated after the input voltage Vin starts changing. This allows achieving the calibration during the driving of the output voltage Vout, advantageously improving the operation speed of the integrated circuit 100.

Figure 4:
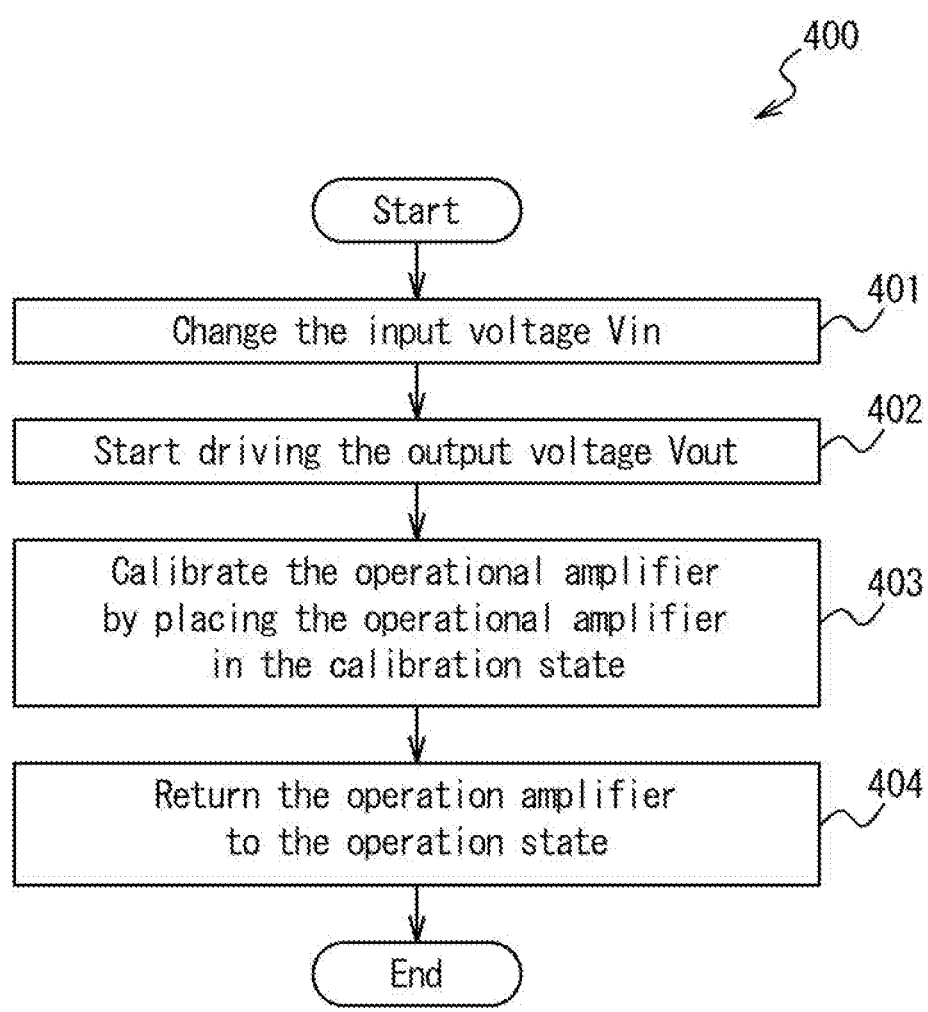
FIG. 4 is a flowchart illustrating an example operation of an operational amplifier, according to one or more embodiments.

Method 400 of FIG. 4 illustrates steps for operating the operational amplifier 2, according to one or more embodiments. In the illustrated embodiment, the input voltage supply circuitry 1 changes the input voltage Vin in step 401. The input voltage supply circuitry 1 may drive the input voltage Vin to a desired voltage level different from the original voltage level.

In step 402, the operational amplifier 2 starts driving the output voltage Vout in response to the change in the input voltage Vin. The operational amplifier 2 is placed in the operation state in step 402. The output voltage Vout is driven toward the voltage level of the input voltage Vin.

The operational amplifier 2 is then calibrated by placing the operational amplifier 2 into the calibration state in step 403. This achieves programming the offset cancelling capacitor C1 with an offset cancelling voltage.

The operational amplifier 2 continues to drive the output voltage Vout after the operational amplifier 2 is placed into the calibration state. While the output stage 12 is disconnected from the front stage 11 in the calibration state, the phase compensation capacitors C3 and C4 temporarily maintain the gate voltages of the PMOS transistor MP8 and the NMOS transistor MN8 to continue the driving of the output voltage Vout.

In step 404, the operational amplifier 2 is returned to the operation state. The operational amplifier 2 further drives the output voltage Vout until the output voltage Vout reaches the voltage level of the input voltage Vin.

Figure 5:
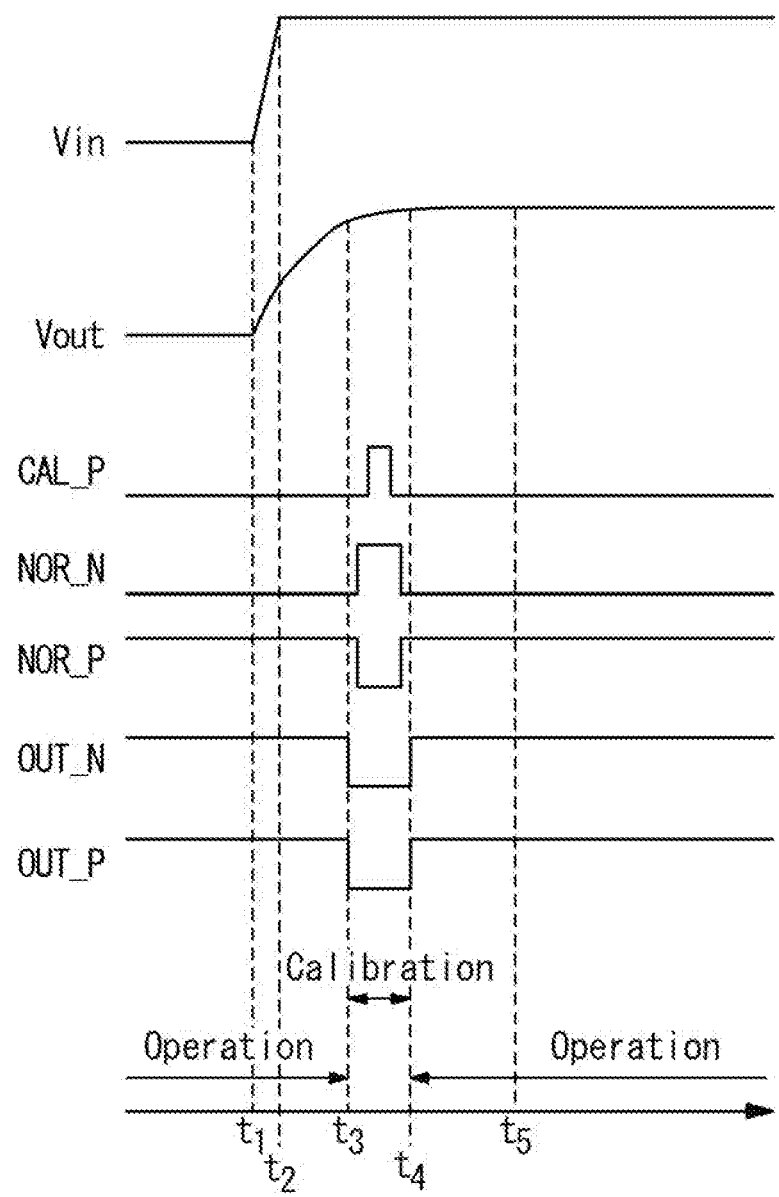
FIG. 5 illustrates an example operation of an operational amplifier, according to one or more embodiments.

FIG. 5 is a timing chart illustrating an example operation of the operational amplifier 2, according to one or more embodiments. In FIG. 5, the switch control signals CAL_P, NOR_N, NOR_P, OUT_N, and OUT_P are illustrated as high-active signals. Initially, the operational amplifier 2 is placed in the operational state.

In the illustrated embodiment, the input voltage supply circuitry 1 changes the input voltage Vin during the period between time $t_1$ and time $t_2$. The input voltage supply circuitry 1 starts driving the input voltage Vin at time $t_1$ and the input voltage Vin reaches a second voltage level at time $t_2$. In embodiments where the output voltage Vout is used to drive a source line of a display panel, the second voltage level may be specified by image data associated with the source line. In response to the change in the input voltage Vin, the operational amplifier 2 starts driving the output voltage Vout at time $t_1$. In the illustrated embodiment, the output voltage Vout does not reach the voltage level of the input voltage Vin at time $t_3$.

The operational amplifier 2 is then calibrated between time $t_3$ and time $t_4$. The calibration process includes disconnecting the output stage 12 from the front stage 11. This is achieved by deasserting the switch control signals OUT_N and OUT_P to turn off the connection switches SW5 and SW6 of the switch circuitry 13. The calibration process further includes short-circuiting the commonly-connected gates of the PMOS transistor MP1 and the NMOS transistor MN1 to the commonly-connected gates of the PMOS transistor MP2 and the NMOS transistor MN2. This is achieved by asserting the switch control signal NOR_N to turn on the short-circuit switch SW1. The calibration process further includes disconnecting the output terminal 15 from the gates of the PMOS transistor MP2 and the NMOS transistor MN2. This is achieved by deasserting the switch control signal NOR_P to turn off the feedback path switch SW2. The calibration process further includes programming the offset cancelling capacitor C1 with an offset canceling voltage. This is achieved by asserting the switch control signal CAL_P to turn on the calibration enable switch SW3. The turn-on of the calibration enable switch SW3 places the operational amplifier 2 into the calibration state. In the calibration state, the offset cancelling capacitor C1 is electrically connected between the nodes N1 and N2 and programmed with the voltage between the nodes N1 and N2. After the offset cancelling capacitor C1 is programmed, the switch control signal CAL_P is deasserted to turn off the calibration enable switch SW3. This is followed by deasserting the switch control signal NOR_N to turn off the short-circuit switch SW1 and asserting the switch control signal NOR_P to turn on the feedback path switch SW2. The switch control signals OUT_N and OUT_P are then asserted to turn on the connection switches SW5 and SW6. This completes the calibration process and returns the operational amplifier 2 to the operation state at time $t_4$.

In various embodiments, the operational amplifier 2 continues to drive the output voltage Vout after the output stage 12 is disconnected from the front stage 11 as the phase compensation capacitors C3 and C4 maintain the gate voltages of the PMOS transistor MP8 and the NMOS transistor MN8. The disconnection of the output stage 12 from the front stage 11 during the period between time $t_3$ and $t_4$ causes only a limited effect on the output voltage Vout.

At time $t_4$, the operational amplifier 2 is returned to the operation state. The operational amplifier 2 drives the output voltage Vout toward the voltage level of the input voltage Vin between time $t_4$ and $t_5$. At time $t_5$, the output voltage Vout reaches the voltage level of the input voltage Vin. The operation illustrated in FIG. 5, in which the calibration is performed during the driving of the output voltage Vout after the change in the input voltage Vin, offers an improved operation speed.

Figure 6:
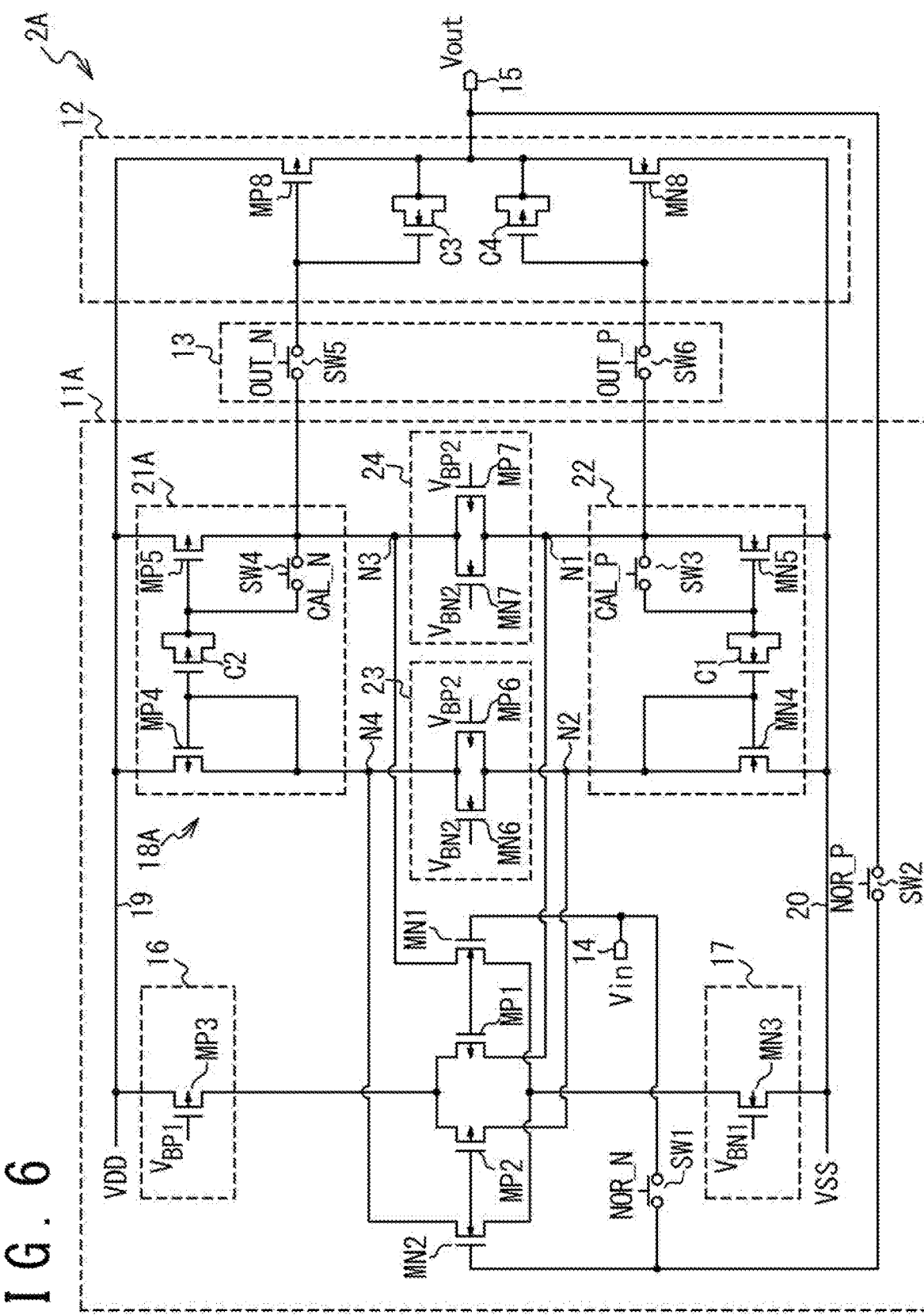
FIG. 6 illustrates an example configuration of an operational amplifier, according to one or more embodiments.

FIG. 6 illustrates an example configuration of an operational amplifier 2A, according to other embodiments. The operational amplifier 2A is configured similarly to the operational amplifier 2 described in relation to FIG. 2, except for that the active load 18A of the front stage 11A comprises an current mirror 21A in place of the current mirror 21. The current mirror 21A is configured to provide offset canceling of the operational amplifier 2A, similarly to the current mirror 22.

In the embodiment illustrated, the current mirror 21A comprises an offset canceling capacitor C2 and a calibration enable switch SW4 in addition to the PMOS transistors MP4 and MP5. The offset canceling capacitor C2 is connected between the gates of the PMOS transistors MP4 and MP5. The offset canceling capacitor C2 is used to hold an offset canceling voltage. In one implementation, a gate capacitance of a PMOS transistor may be used as the offset cancelling capacitor C2. The calibration enable switch SW4 is connected in series to the offset canceling capacitor C2 between the nodes N3 and N4. The calibration enable switch SW4 is controlled by a switch control signal CAL_N received from the controller 3. In one implementation, the calibration enable switch SW4 is turned on during the calibration process to enable programming the offset canceling capacitor C2.

The operation of the operational amplifier 2A is similar to that of the operational amplifier 2 described in relation to FIG. 2, except for that the calibration enable switch SW4 is turned on to program the offset cancelling capacitor C2 in the calibration state. In the calibration state, the short-circuit switch SW1 is turned on and a non-zero voltage may be generated between the nodes N3 and N4. The offset cancelling capacitor C2 is programed with the voltage generated between the nodes N3 and N4 in the calibration state.

Figure 7:
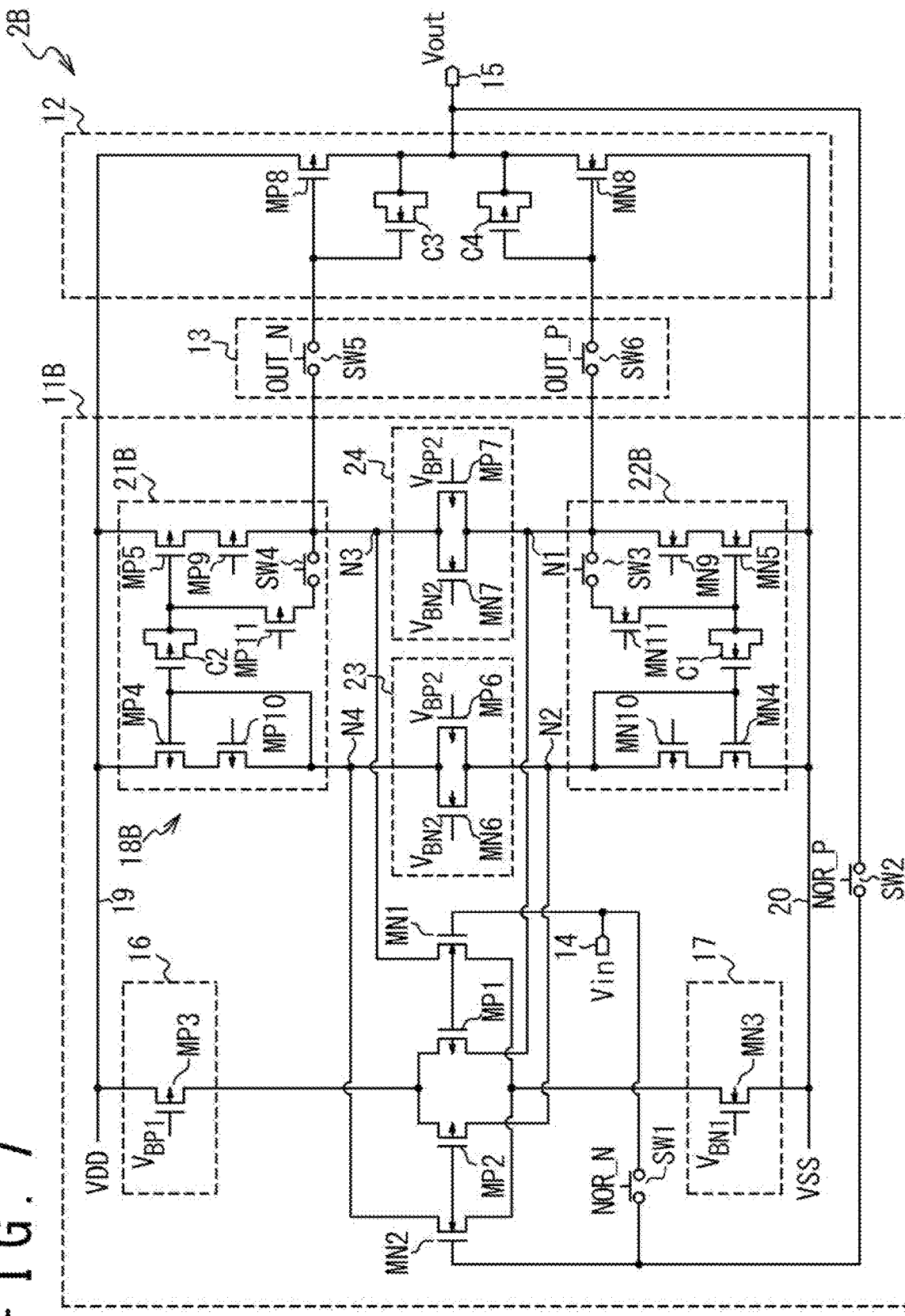
FIG. 7 illustrates an example configuration of an operational amplifier, according to one or more embodiments.

FIG. 7 illustrates an example configuration of an operational amplifier 2B, according to still other embodiments. The operational amplifier 2B is configured similarly to the operational amplifier 2A described in relation to FIG. 6, except for that the active load 18B of the front stage 11B comprises current mirrors 21B and 22B in place of the current mirrors 21A and 22.

The current mirror 21B comprises gate-biased PMOS transistors MP9, MP10 and MP11 in addition to the PMOS transistors MP4, MP5, the offset canceling capacitor C2, and the calibration enable switch SW4. The gate-biased PMOS transistors MP9 is connected between the drain of the PMOS transistor MP5 and the node N3, which is connected to the gate of the PMOS transistor MP8 via the connection switch SW5. The gate-biased PMOS transistor MP9 has a gate biased with a fixed bias voltage, a source connected to the drain of the PMOS transistor MP5, and a drain connected to the node N3. The gate-biased PMOS transistor MP10 has a gate biased with a fixed bias voltage, a source connected to the drain of the PMOS transistor MP4, and a drain connected to the node N4. The gate-biased PMOS transistor MP11 has a gate biased with a fixed bias voltage, a source connected to the offset canceling capacitor C2, and a drain connected to the node N3 via the calibration enable switch SW4. In one or more embodiments, the fixed bias voltages on the gates of the PMOS transistors MP9 and MP10 may be VDD−(Vthp+Δov), and the fixed bias voltage on the PMOS transistor MP11 may be VDD−2×Vthp, where Vthp is the threshold voltage of the PMOS transistors MP9, MP10, and MP11, and Δov is an overdrive voltage. In one implementation, the threshold voltage Vthp of the PMOS transistors MP9, MP10, and MP11 may range from 0.5V to 1.0V, and the overdrive voltage Δov may be 0.2V. In some embodiments, the fixed bias voltages on the gates of the PMOS transistors MP9 and MP10 may range from VDD−1.2V to VDD−0.7V, and the fixed bias voltage on the gate of the PMOS transistor MP11 may range from VDD−2.0V to VDD−1.0V.

The current mirrors 22B comprises gate-biased NMOS transistors MN9, MN10 and MN11 in addition to the NMOS transistors MN4, MN5, the offset canceling capacitor C1, and the calibration enable switch SW3. The gate-biased NMOS transistors MN9 is connected between the drain of the NMOS transistor MN5 and the node N1, which is connected to the gate of the NMOS transistor MN8 via the connection switch SW6. The gate-biased NMOS transistor MN9 has a gate biased with a fixed bias voltage, a source connected to the drain of the NMOS transistor MN5 and a drain connected to the node N1. The gate-biased NMOS transistor MN10 has a gate biased with a fixed bias voltage, a source connected to the drain of the NMOS transistor MN4, and a drain connected to the node N2. The gate-biased NMOS transistor MN11 has a gate biased with a fixed bias voltage, a source connected to the offset canceling capacitor C1, and a drain connected to the node N1 via the calibration enable switch SW3. In one or more embodiments, the fixed bias voltages on the gates of the NMOS transistors MN9 and MN10 may be VSS+(Vthn+Δov), and the fixed bias voltage on the NMOS transistor MN11 may be VSS+2×Vthn, where Vthn is the threshold voltage of the NMOS transistors MN9, MN10, and MN11. In one implementation, the threshold voltage Vthn of the NMOS transistors MN9, MN10, and MN11 may range from 0.5V to 1.0V. In some embodiments, the fixed bias voltages on the gates of the NMOS transistors MN9 and MN10 may range from VSS+0.7V to VSS+1.2V, and the fixed bias voltage on the gate of the NMOS transistor MN11 may range from VSS+1.0V to VSS+2.0V.

The PMOS transistor MP9 of the current mirror 21B effectively suppresses an effect of a change in the voltage level on the gate of the PMOS transistor MP8 on the offset canceling voltage held across the offset canceling capacitor C2. In the configuration of the operational amplifier 2B illustrated in FIG. 7, a change in the gate voltage of the PMOS transistor MP8 may have an effect on the offset canceling voltage held across the offset canceling capacitor C2 due to capacitive coupling between the gate and drain of the PMOS transistor MP5. The PMOS transistor MP9, disposed between the PMOS transistor MP5 and the gate of the PMOS transistor MP8, effectively mitigates the effect of the change in the gate voltage level of the PMOS transistor MP8.

Further, the NMOS transistor MN9 of the current mirror 22B effectively suppresses an effect of a change in the voltage level on the gate of the NMOS transistor MN8 on the offset canceling voltage held across the offset canceling capacitor C1. The NMOS transistor MN9, disposed between the NMOS transistor MN5 and the gate of the NMOS transistor MN8, effectively mitigates the effect of the change in the gate voltage level of the NMOS transistor MN8.

The PMOS transistor MP10 and the NMOS transistor MN10 are disposed to maintain circuit symmetricity of the current mirrors 21B and 22B in relation to the provision of the PMOS transistor MP9 and the NMOS transistor MN9.

The PMOS transistor MP11 adjusts the offset canceling voltage held across the offset canceling capacitor C2 in relation to the provision of the PMOS transistor MP9. In one or more embodiments, the PMOS transistor MP11 causes a voltage drop identical to that across the PMOS transistor MP9 and this enables suitably adjusting the voltage level of the offset canceling voltage to reduce the offset voltage of the operational amplifier 2B.

Further, the NMOS transistor MN11 adjusts the offset canceling voltage held across the offset canceling capacitor C1 in relation to the provision of the NMOS transistor MN9. In one or more embodiments, the NMOS transistor MN11 causes a voltage drop identical to that across the NMOS transistor MN9 and this enables suitably adjusting the voltage level of the offset canceling voltage to reduce the offset voltage of the operational amplifier 2B.

Figure 8:
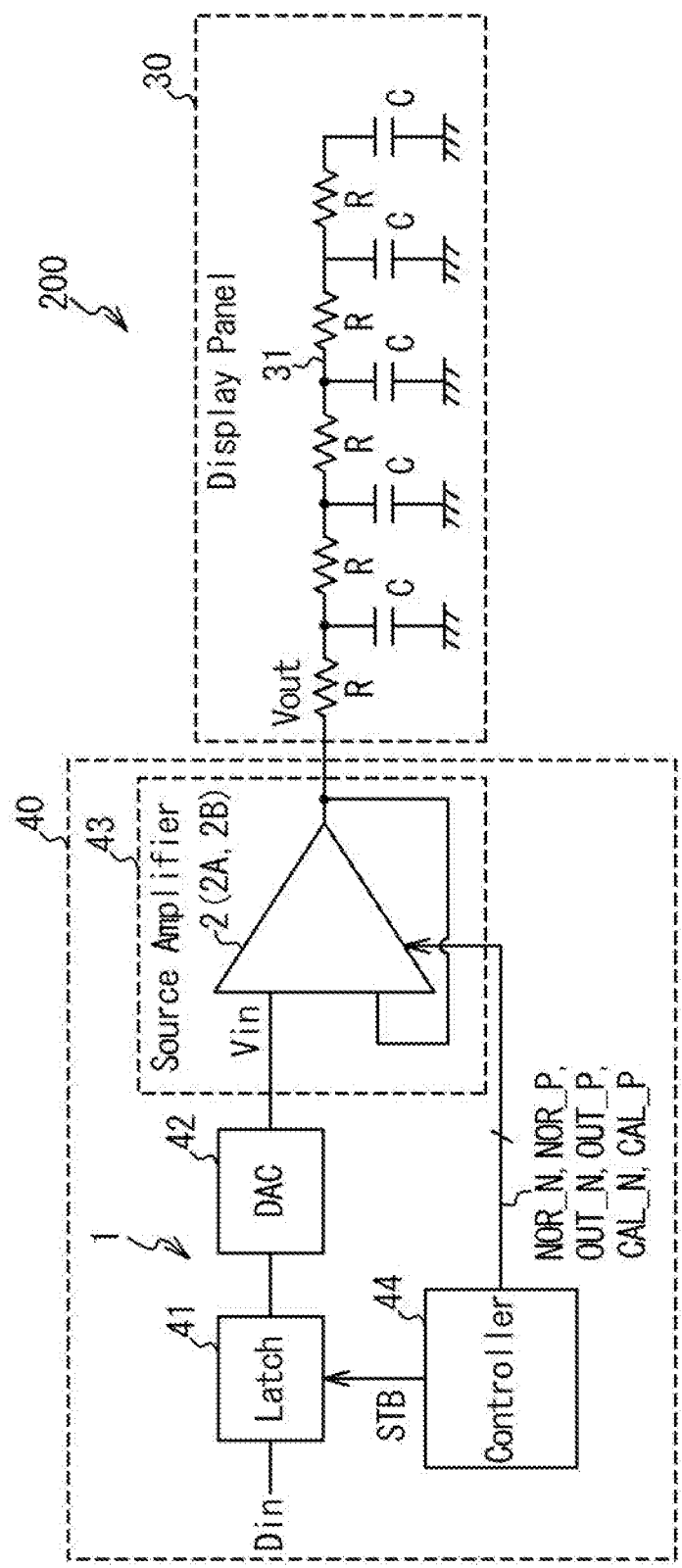
FIG. 8 illustrates an example implementation of an operational amplifier, according to one or more embodiments.

FIG. 8 illustrates an example implementation of the operational amplifier 2, 2A, and 2B, according to one or more embodiments. In the illustrated embodiment, a display device 200 comprises a display panel 30 and a display driver 40 configured to drive the display panel 30. The display driver 40 comprises a source amplifier 43 in which an operational amplifier 2, 2A, or 2B is integrated. The output of the source amplifier 43 is connected to a source line 31 of the display panel 30. The source line 31 has distributed resistance and capacitance, which are illustrated in the form of a resistor-capacitor ladder in FIG. 8.

The display driver 40 further comprises a latch 41, a digital-to-analog converter (DAC) 42, and a controller 44. The latch 41 is configured to latch image data in response to a strobe signal STB received from the controller 44. In one implementation, the latch 41 may be configured to latch the image data in response to an assertion of the strobe signal STB. The image data may include a grayscale value associated with a pixel circuit (not illustrated) connected to the source line 31. The DAC 42 is configured to apply digitalto-analog conversion to the received image data to generate and supply the input voltage Vin to the source amplifier 43. The latch 41 and the DAC 42 operate as the input voltage supply circuitry 1 described in relation to FIG. 1. The controller 44 is configured to supply the strobe signal STB to the latch 41 and supply the switch control signals NOR_N, NOR_P, OUT_N, OUT_P, and CAL_P, and CAL_N if applicable.

In one or more embodiments, the input voltage Vin changes upon an update of the image data Din in the latch 41 in a display line update period of a horizontal sync period. In such embodiments, the operational amplifier 2, 2A or 2B is calibrated after the change of the input voltage Vin in the display line update period. This operation enables concurrently achieves the calibration of the operational amplifier 2, 2A or 2B and the driving of the source line 31 in the display line update period, enhancing the operation speed of the source amplifier 43.

While various embodiments have been specifically described herein, a person skilled in the art would appreciate that the technologies disclosed herein may be implemented with various modifications.

What is claimed is:

1. An operational amplifier, comprising:
   a front stage comprising:
   a first input transistor;
   a second input transistor;
   a first node on which a first voltage is generated depending on a first current through the first input transistor;
   a second node on which a second voltage is generated depending on a second current through the second input transistor; and
   a first current mirror; and
   an output stage configured to generate an output voltage depending on at least one of the first voltage and the second voltage;
   wherein the first current mirror comprises:
   a first transistor having a drain connected to the first node;
   a second transistor having a drain connected to the second node; and
   a first offset canceling capacitor connected between gates of the first transistor and the second transistor, and
   wherein the front stage is configured to program the first offset canceling capacitor with a voltage generated between the first node and the second node.

2. The operational amplifier of claim 1, wherein the front stage further comprises a first calibration enable switch connected in series to the first offset canceling capacitor between the first node and the second node.

3. An operational amplifier, comprising:
   a front stage comprising:
   a first input transistor,
   a second input transistor,
   a first node on which a first voltage is generated depending on a first current through the first input transistor,
   a second node on which a second voltage is generated depending on a second current through the second input transistor, and
   a first current mirror; and
   an output stage configured to generate an output voltage depending on at least one of the first voltage and the second voltage,
   wherein the first current mirror comprises:
   a first transistor having a drain connected to the first node,
   a second transistor having a drain connected to the second node, and
   a first offset canceling capacitor connected between gates of the first transistor and the second transistor,
   wherein an input terminal of the operational amplifier is connected to a gate of one of the first input transistor and the second input transistor, and
   wherein the front stage is further configured to connect an output terminal of the operational amplifier to a gate of the other of the first input transistor and the second input transistor.

4. The operational amplifier of claim 3, wherein the front stage is configured to short-circuit the gates of the first input transistor and the second input transistor.

5. The operational amplifier of claim 1, further comprising switch circuitry configured to selectively connect the output stage to the front stage.

6. An operational amplifier, comprising:
   a front stage comprising:
   a first input transistor,
   a second input transistor,
   a first node on which a first voltage is generated depending on a first current through the first input transistor,
   a second node on which a second voltage is generated depending on a second current through the second input transistor, and
   a first current mirror;
   an output stage configured to generate an output voltage depending on at least one of the first voltage and the second voltage; and
   switch circuitry configured to selectively connect the output stage to the front stage,
   wherein the first current mirror comprises:
   a first transistor having a drain connected to the first node,
   a second transistor having a drain connected to the second node, and
   a first offset canceling capacitor connected between gates of the first transistor and the second transistor,
   wherein the operational amplifier has a calibration state in which the operational amplifier is calibrated,
   wherein an input terminal of the operational amplifier is connected to a gate of the first input transistor,
   wherein an output terminal of the operational amplifier is connectable to a gate of the second input transistor,
   wherein, in the calibration state, the front stage is configured to:
   short-circuit the gates of the first input transistor and the second input transistor,
   disconnect the gate of the second input transistor from the output terminal, and
   connect the first offset canceling capacitor between the first node and the second node, and
   wherein the switch circuitry is configured to disconnect the output stage from the front stage in the calibration state.

7. The operational amplifier of claim 6, wherein the operational amplifier further has an operation state,
   wherein, in the operation state, the front stage is configured to:
   disconnect the gate of the first input transistor from the gate of the second input transistor;
   connect the gate of the second input transistor to the output terminal; and disconnect the first offset canceling capacitor from one of the first node and the second node, wherein the switch circuitry is configured to connect the output stage to the front stage in the operation state.

8. The operational amplifier of claim 1, wherein the first current mirror further comprises a first gate-biased transistor connected between the output stage and the first transistor, the first gate-biased transistor having a gate biased with a first fixed bias voltage.

9. An operational amplifier, comprising:
a front stage comprising:
  a first input transistor,
  a second input transistor,
  a first node on which a first voltage is generated depending on a first current through the first input transistor,
  a second node on which a second voltage is generated depending on a second current through the second input transistor, and
  a first current mirror; and
an output stage configured to generate an output voltage depending on at least one of the first voltage and the second voltage,
wherein the first current mirror comprises:
  a first transistor having a drain connected to the first node,
  a second transistor having a drain connected to the second node, and
  a first offset canceling capacitor connected between gates of the first transistor and the second transistor,
wherein the front stage further comprises:
  a third input transistor,
  a fourth input transistor,
  a third node on which a third voltage is generated depending on a third current through the third input transistor,
  a fourth node on which a fourth voltage is generated depending on a fourth current through the fourth input transistor, and
a second current mirror comprises:
  a third transistor having a drain connected to the third node,
  a fourth transistor having a drain connected to the fourth node, and
  a second offset canceling capacitor connected between gates of the third transistor and the fourth transistor.

10. The operational amplifier of claim 9, wherein the front stage is configured to program the second offset canceling capacitor with a voltage generated between the third node and the fourth node.

11. The operational amplifier of claim 10, wherein the front stage further comprises:
a first gate-biased transistor connected between the output stage and the first current mirror, the first gate-biased transistor having a gate biased with a first fixed bias voltage, and
a second gate-biased transistor connected between the output stage and the first current mirror, the first gate-biased transistor having a gate biased with a second fixed bias voltage.

12. An integrated circuit, comprising:
an operational amplifier; and
input voltage supply circuitry configured to supply an input voltage to the operational amplifier,
wherein the operational amplifier comprises:
a front stage comprising:
  a first input transistor,
  a second input transistor,
  a first node on which a first voltage is generated depending on a first current through the first input transistor,
  a second node on which a second voltage is generated depending on a second current through the second input transistor, and
  a first current mirror, and
an output stage configured to output an output voltage depending on at least one of the first voltage and the second voltage,
wherein the first current mirror comprises:
  a first transistor having a drain connected to the first node,
  a second transistor having a drain connected to the second node, and
  a first offset canceling capacitor connected between gates of the first transistor and the second transistor,
wherein the operational amplifier further comprises switch circuitry configured to selectively connect the output stage to the front stage,
wherein an input terminal of the operational amplifier is connected to a gate of the first input transistor,
wherein an output terminal of the operational amplifier is connectable to a gate of the second input transistor,
wherein the operational amplifier has a calibration state in which the operational amplifier is calibrated,
wherein, in the calibration state, the front stage is configured to:
  short-circuit the gates of the first input transistor and the second input transistor,
  disconnect the gate of the second input transistor from the output terminal, and
  connect the first offset canceling capacitor between the first node and the second node, and
wherein the switch circuitry is configured to disconnect the output stage from the front stage in the calibration state.

13. The integrated circuit of claim 12, further comprising a controller,
wherein the input voltage supply circuitry configured to change the input voltage,
wherein the operational amplifier is configured to drive the output voltage in response to a change in the input voltage,
wherein the controller is configured to place the operational amplifier in the calibration state after the change in the input voltage.

14. The integrated circuit of claim 13, wherein the controller is configured to place the operational amplifier in the calibration state before the output voltage reaches a voltage level of the input voltage.

15. The integrated circuit of claim 12, wherein the operational amplifier further has an operation state,
wherein, in the operation state, the front stage is configured to:
  disconnect the gate of the first input transistor from the gate of the second input transistor;
  connect the gate of the second input transistor to the output terminal; and
  disconnect the first offset canceling capacitor from one of the first node and the second node,
wherein the switch circuitry is configured to connect the output stage to the front stage in the operation state.

16. The integrated circuit of claim 12, wherein the input voltage supply circuitry is configured to supply the input voltage based on image data.

\* \* \* \* \*